United States Patent
Chilappagari et al.

(10) Patent No.: US 9,548,764 B1
(45) Date of Patent: Jan. 17, 2017

(54) MEMORY EFFICIENT DECODERS FOR LOW-DENSITY PARITY-CHECK CODES

(71) Applicant: Marvell International LTD., Hamilton (BM)

(72) Inventors: Shashi Kiran Chilappagari, San Jose, CA (US); Dung Viet Nguyen, San Jose, CA (US)

(73) Assignee: Marvell International LTD., Hamilton (BM)

( * ) Notice: Subject to any disclaimer, the term of this patent is extended or adjusted under 35 U.S.C. 154(b) by 148 days.

(21) Appl. No.: 14/537,012

(22) Filed: Nov. 10, 2014

Related U.S. Application Data

(60) Provisional application No. 61/911,285, filed on Dec. 3, 2013.

(51) Int. Cl.
*H03M 13/00* (2006.01)
*H03M 13/11* (2006.01)

(52) U.S. Cl.
CPC ..... *H03M 13/6312* (2013.01); *H03M 13/1102* (2013.01); *H03M 13/116* (2013.01)

(58) Field of Classification Search
CPC .......... H03M 13/1137; H03M 13/1185; H03M 13/3746
See application file for complete search history.

(56) References Cited

U.S. PATENT DOCUMENTS

| | | | |
|---|---|---|---|
| 2007/0013561 A1* | 1/2007 | Xu | H03M 7/30 341/50 |
| 2010/0017684 A1* | 1/2010 | Yang | G11C 11/5642 714/773 |
| 2014/0129894 A1* | 5/2014 | Branco | H03M 13/1137 714/752 |

\* cited by examiner

*Primary Examiner* — Guy Lamarre

(57) ABSTRACT

A decoder including a compression module configured to select one or more nodes from a plurality of nodes associated with data being decoded by the decoder, where each node includes one or more bits, and to compress the one or more bits associated with the selected nodes. A memory is configured to store the compressed one or more bits associated with the selected nodes.

22 Claims, 10 Drawing Sheets

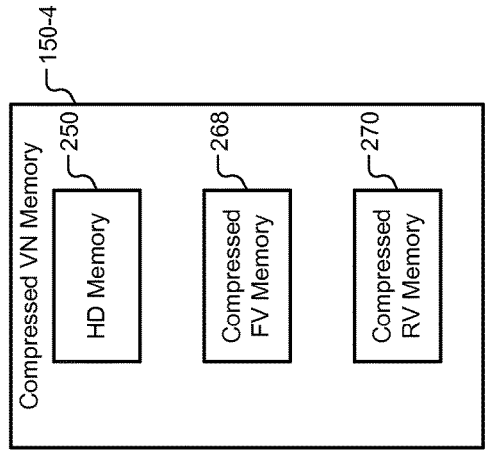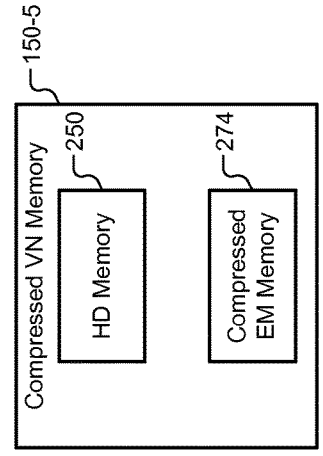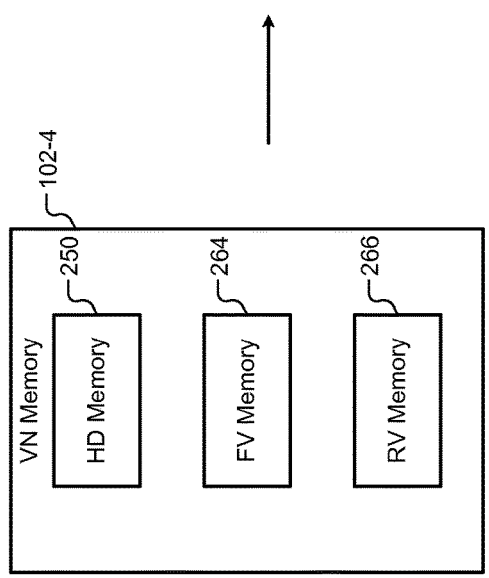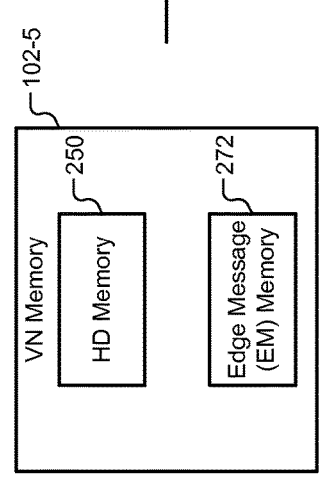
FIG. 13
FIG. 14

MEMORY EFFICIENT DECODERS FOR LOW-DENSITY PARITY-CHECK CODES

CROSS-REFERENCE TO RELATED APPLICATIONS

This application claims the benefit of U.S. Provisional Application No. 61/911,285, filed on Dec. 3, 2013. The entire disclosures of the applications referenced above are incorporated herein by reference.

FIELD

The present disclosure relates generally to decoders utilizing error-correcting codes to decode data in communication and storage devices and more particularly to memory efficient decoders for low-density parity-check (LDPC) codes.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In communication systems, channel noise may cause transmission errors between a source and a receiver. Error correction coding (ECC) may detect and correct channel transmission errors. Low-density parity-check (LDPC) codes are examples of ECC block codes that may be used to detect and correct channel transmission errors.

FIG. 1 shows a functional block diagram of a communication system 10. The communication system 10 may include an encoder 12, a modulator 14, a channel 16, a demodulator 18, and an iterative decoder 20. The iterative decoder 20 may include a channel detector 22 and a decoder 24. For example, the encoder 12 and the decoder 24 may use an LDPC code.

Using the LDPC code, the encoder 12 encodes a stream of datawords (u) from a source. A dataword may refer to a group of binary data bits that is suitable for input to the encoder 12. The encoder 12 outputs a stream of codewords (c), which may be in the form of binary data. A codeword may refer to a group of bits generated by the encoder 12 based on an input dataword.

LDPC codes are block codes. An LDPC code may be represented by an (M×N) parity-check matrix (H) that includes M rows and N columns. M may represent a number of constraints, such as parity-check equations. N may represent a number of bits. Entries of the parity-check matrix may be ones or zeros.

The modulator 14 modulates the frequency, amplitude, and/or phase of the stream of codewords to generate a transmit signal (w) that includes a modulated communication signal or a modulated storage signal (hereinafter a modulated signal). For example, the channel 16 may include a storage medium, such as a magnetic storage medium, an optical storage medium, or a memory integrated circuit. The channel 16 may also include a communication channel (e.g., a wireless or a wireline communication channel). The channel 16 provides a receive signal (w'), which may represent the transmit signal corrupted by noise (n) or other interference.

The demodulator 18 demodulates the receive signal and provides an initial estimate signal (r') of the stream of codewords. The channel detector 22 of the iterative decoder 20 receives the initial estimate signal, which may be based on hard information in blocks of data. The initial estimate signal may include corrupted bits. Hard information represents hard decisions on whether data bits are ones or zeros. For example, a hard decision for a bit may be either a one or a zero.

The channel detector 22 may generate soft information via a soft decision that is based on the initial estimate signal and data from the channel 16. Soft information represents soft decisions on whether data bits are ones or zeros. For example, a soft decision for a bit may be a real number that represents a probability or a likelihood of belief (e.g., a log-likelihood ratio or LLR) that the bit is a one or a zero.

For example, the channel detector 22 may generate the soft information based on the Viterbi algorithm. The channel detector 22 may also generate the soft information based on channel factors such as a type of modulation used by the modulator 14 and channel parameters such as additive white Gaussian noise (AWGN).

The decoder 24 receives the soft information and may attempt to satisfy M parity-check equations of the parity-check matrix using the soft information. However, if one or more of the parity-check constraints are not satisfied, the decoder 24 may generate feedback information. For example, a message-passing algorithm such as a sum-product algorithm may be used to generate the feedback information. In such an example, feedback messages from check nodes may be summed to generate the feedback information for a bit.

The channel detector 22 receives the feedback information and may update the soft information from the channel based on the feedback information. For example, the channel detector 22 may sum the soft information and the feedback information to generate updated soft information. The decoder 24 receives the updated soft information, and the process repeats.

For example, the iterative decoder 20 may repeat the process for numerous iterations to decode an entire block of data. The iterative decoder 20 may continue until a valid codeword is found that satisfies all M parity-check equations. The iterative decoder 20 may also continue until an allotted time has elapsed or when a certain number of iterations have occurred.

The iterative decoder 20 generates an estimate signal (r) based on the soft information and the iterative decoding process. The estimate signal represents an estimate of the original transmitted stream of datawords. For example, the estimate signal may include the most likely datawords. The estimate signal may also include the original stream of datawords if no error exists.

Referring now to FIG. 2A, the decoder 24 may include a plurality of nodes 30. The nodes 30 illustrate the iterative message-passing process between variable and check nodes that is used by a typical decoder 24. For example, the nodes 30 represents the following parity-check matrix H:

$$H = \begin{bmatrix} 1 & 1 & 1 & 0 & 0 & 0 \\ 1 & 0 & 0 & 1 & 1 & 0 \\ 0 & 1 & 1 & 0 & 0 & 1 \\ 0 & 0 & 0 & 1 & 1 & 1 \end{bmatrix}.$$

The nodes 30 may include check nodes $c_0$ (34-0), $c_1$ (34-1), $c_2$ (34-2), and $c_3$ (34-3) (collectively referred to as check nodes 34). The nodes 30 may also include variable nodes $v_0$ (36-0), $v_1$ (36-1), $v_2$ (36-2), $v_3$ (36-3), $v_4$ (36-4), and $v_5$ (36-5) (collectively referred to as variable nodes 36).

FIG. 2B shows the relationship between the check nodes 34, the variable nodes 36, and the parity-check matrix H. The variable nodes 36 correspond to the N columns of the parity-check matrix H. The check nodes 34 correspond to the M rows of the parity-check matrix H.

The interacting nodes 30 may be referred to as a bipartite graph (called a Tanner graph) because no nodes of the same type (i.e., variable nodes and check nodes) are connected to each other. Communication lines (called edges) connect check nodes 34 to variable nodes 36. For example, one of the check nodes 34 is connected to one of the variable nodes 36 if the corresponding entry in the parity-check matrix is a one. For example, check node $c_0$ (34-0) is connected to variable node $v_0$ (36-0) because $H_{0,0}=1$.

Information received from the channel 16 is communicated to the variable nodes 36 via the channel detector 22. The variable nodes 36 may pass the information up to the check nodes 34. For example, variable node $v_0$ (36-0) may pass a message (i.e., channel information) to check nodes $c_0$ (34-0) and $c_1$ (34-1) because the nodes are connected.

The check nodes 34 may compute messages based on the information received from the variable nodes 36. For example, one of the check nodes 34 may compute a message by summing all messages received from variable nodes 36. The check nodes 34 may then pass the messages back to respective variable nodes 36.

For example, check node $c_0$ (34-0) may compute a message by summing messages received from variable nodes $v_0$ (36-0), $v_1$ (36-1), and $v_2$ (36-2) because the nodes are connected. Check node $c_0$ (34-0) may also send the message back to variable nodes $v_0$ (36-0), $v_1$ (36-1), and $v_2$ (36-2) because the nodes are connected.

The variable nodes 36 may then compute messages based on the messages received from the check nodes 34. For example, one of the variable nodes 36 may compute a message by summing all messages received from check nodes 34. For example, variable node $v_0$ (36-0) may compute a feedback signal by summing messages received from check nodes $c_0$ (34-0) and $c_1$ (34-1) because the nodes are connected.

The check nodes 34 may send the feedback signals back to the channel detector 22. The channel detector 22 may generate updated soft information based on the feedback signals and the soft information. The decoder 24 then receives the updated soft information.

The iterative message-passing process may be repeated until a predetermined condition is satisfied. After the predetermined condition is satisfied, the iterative decoder 20 may generate and output an estimate signal r. For example, the iterative message-passing process may continue until a predetermined number of iterations have occurred or until all parity-check equations are satisfied. For example, the parity-check equations corresponding to the parity-check matrix H are:

$$c_0 = v_0 + v_1 + v_2$$

$$c_1 = v_0 + v_3 + v_4$$

$$c_2 = v_1 + v_2 + v_5$$

$$c_3 = v_3 + v_4 + v_5.$$

FIG. 3A shows an example of a variable node computation. A variable node 38 receives an initial bit estimate (y), which may be an LLR, from the channel detector 22. The variable node 38 may also receive return messages $x_0$, $x_1$, and $x_2$ from different check nodes. The variable node 38 may generate return messages based on the received return messages and the initial bit estimate. For example, as shown in FIG. 3B, the variable node 38 may generate return messages for each check node by summing all of the other received messages.

SUMMARY

A decoder comprises a compression module and a memory. The compression module is configured to select one or more nodes from a plurality of nodes associated with data being decoded by the decoder, where each node includes one or more bits, and to compress the one or more bits associated with the selected nodes. The memory is configured to store the compressed one or more bits associated with the selected nodes.

In another feature, each of the plurality of nodes includes a variable node or a check node.

In other features, the one or more bits associated with one of the plurality of nodes includes a first bit indicating whether a current estimate associated with the one of the plurality of nodes is flipped relative to a prior value of the current estimate, and a second bit indicating reliability of the current estimate.

In another feature, the one or more bits associated with one of the plurality of nodes includes one or more messages associated with one or more edges between one of the selected nodes and one or more corresponding check nodes.

In another feature, one of the one or more bits is received by the decoder in a compressed form.

In other features, the decoder further comprises a decompression module and an update module. The decompression module is configured to decompress a portion of the compressed one or more bits stored in the memory and to generate decompressed one or more bits. The update module is configured to receive new information to update the portion of the compressed one or more bits, generate an update information based on the new information and the decompressed one or more bits, compress the update information, and update the portion of the compressed one or more bits stored in the memory using the compressed update information.

In another feature, the decoder further comprises a variable node update module configured to receive the decompressed one or more bits and check node information corresponding to the one or more bits stored in a check node memory, and generate the new information to update the portion of the compressed one or more bits based on the decompressed one or more bits and the check node information.

In another feature, the decoder further comprises a check node update module configured to receive the new information and the check node information, generate a check node update information to update the check node information stored in the check node memory, and update the check node information stored in the check node memory using the check node update information.

In other features, in response to the plurality of nodes including a plurality of variable nodes, the compression module is configured to select one or more check nodes from a plurality of check nodes associated with the plurality of variable nodes, where each check node includes one bit, and to compress the one bit associated with the selected check nodes. A memory is configured to store the compressed one bit associated with the selected check nodes.

In another feature, the plurality of variable nodes and the plurality of check nodes form elements of a parity-check matrix associated with a code used by the decoder to decode the data.

In another feature, the code includes a low-density parity-check code or a quasi-cyclic low-density parity-check code.

In other features, the decoder includes a bit flipping decoder, a message-passing bit flipping decoder, or a hybrid message-passing bit flipping decoder.

In still other features, a method comprises selecting one or more nodes from a plurality of nodes associated with data being decoded by a decoder, where each node includes one or more bits; compressing the one or more bits associated with the selected nodes; and storing the compressed one or more bits associated with the selected nodes.

In another feature, each of the plurality of nodes includes a variable node or a check node.

In other features, the one or more bits associated with one of the plurality of nodes includes a first bit indicating whether a current estimate associated with the one of the plurality of nodes is flipped relative to a prior value of the current estimate, and a second bit indicating reliability of the current estimate.

In another feature, the one or more bits associated with one of the plurality of nodes includes one or more messages associated with one or more edges between one of the selected nodes and one or more corresponding check nodes.

In another feature, one of the one or more bits is received by the decoder in a compressed form.

In other features, the method further comprises decompressing a portion of the compressed one or more bits stored in the memory and to generate decompressed one or more bits, receiving new information to update the portion of the compressed one or more bits, generating an update information based on the new information and the decompressed one or more bits, compressing the update information, and updating the portion of the compressed one or more bits stored in the memory using the compressed update information.

In other features, the method further comprises receiving the decompressed one or more bits and check node information corresponding to the one or more bits stored in a check node memory, and generating the new information to update the portion of the compressed one or more bits based on the decompressed one or more bits and the check node information.

In other features, the method further comprises receiving the new information and the check node information, generating a check node update information to update the check node information stored in the check node memory, and updating the check node information stored in the check node memory using the check node update information.

In other features, in response to the plurality of nodes including a plurality of variable nodes, the method further comprises selecting one or more check nodes from a plurality of check nodes associated with the plurality of variable nodes, where each check node includes one bit; compressing the one bit associated with the selected check nodes; and storing the compressed one bit associated with the selected check nodes.

In another feature, the plurality of variable nodes and the plurality of check nodes form elements of a parity-check matrix associated with a code used by the decoder to decode the data.

In another feature, the code includes a low-density parity-check code or a quasi-cyclic low-density parity-check code.

In other features, the decoder includes a bit flipping decoder, a message-passing bit flipping decoder, or a hybrid message-passing bit flipping decoder.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

FIGS. 10-14 show examples of different embodiments of the compression scheme.

In the drawings, reference numbers may be reused to identify similar and/or identical elements.

DESCRIPTION

Figure 1:
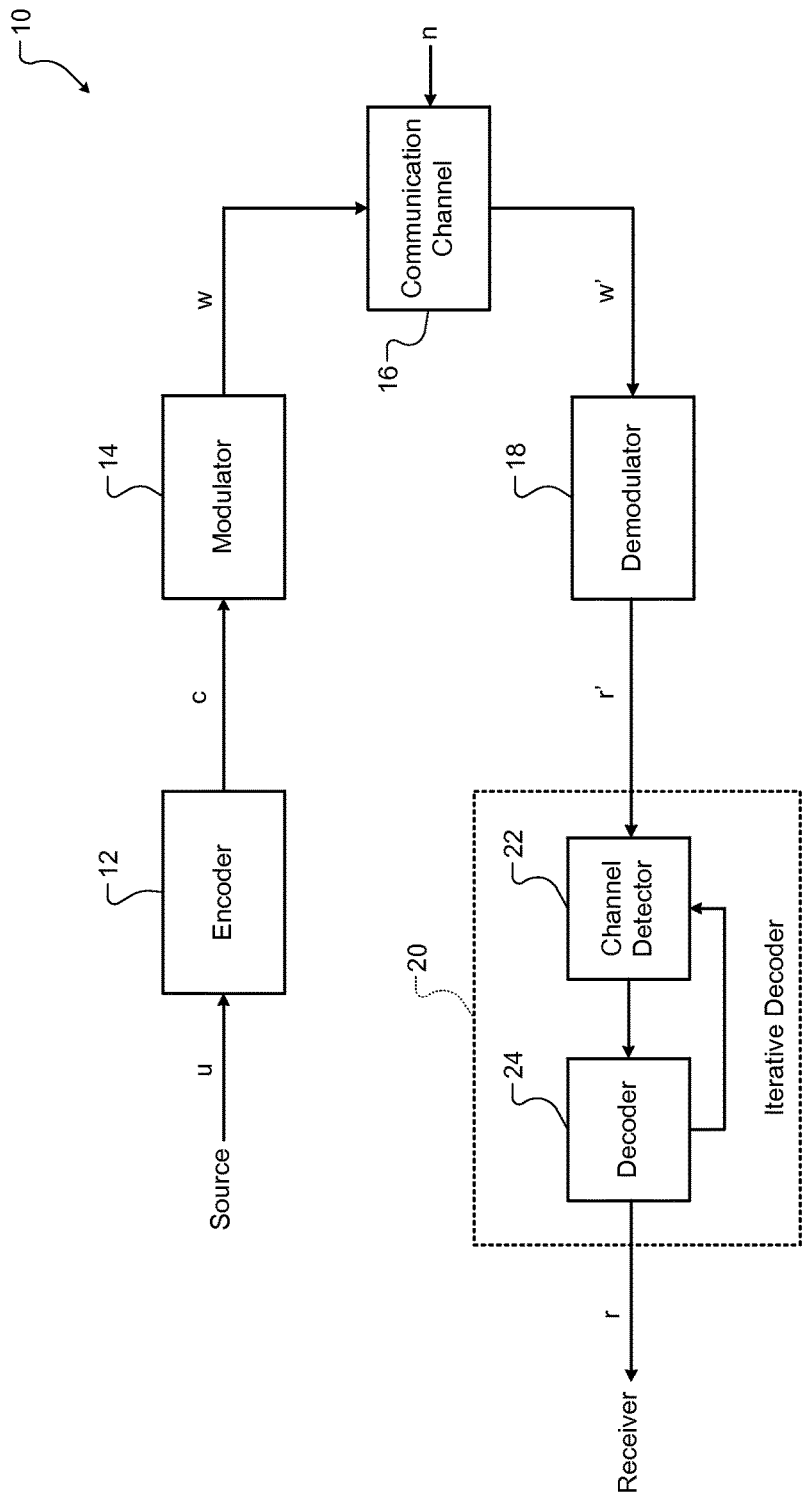
FIG. 1 is a functional block diagram of a communication system.
Figures 2A, 2B:
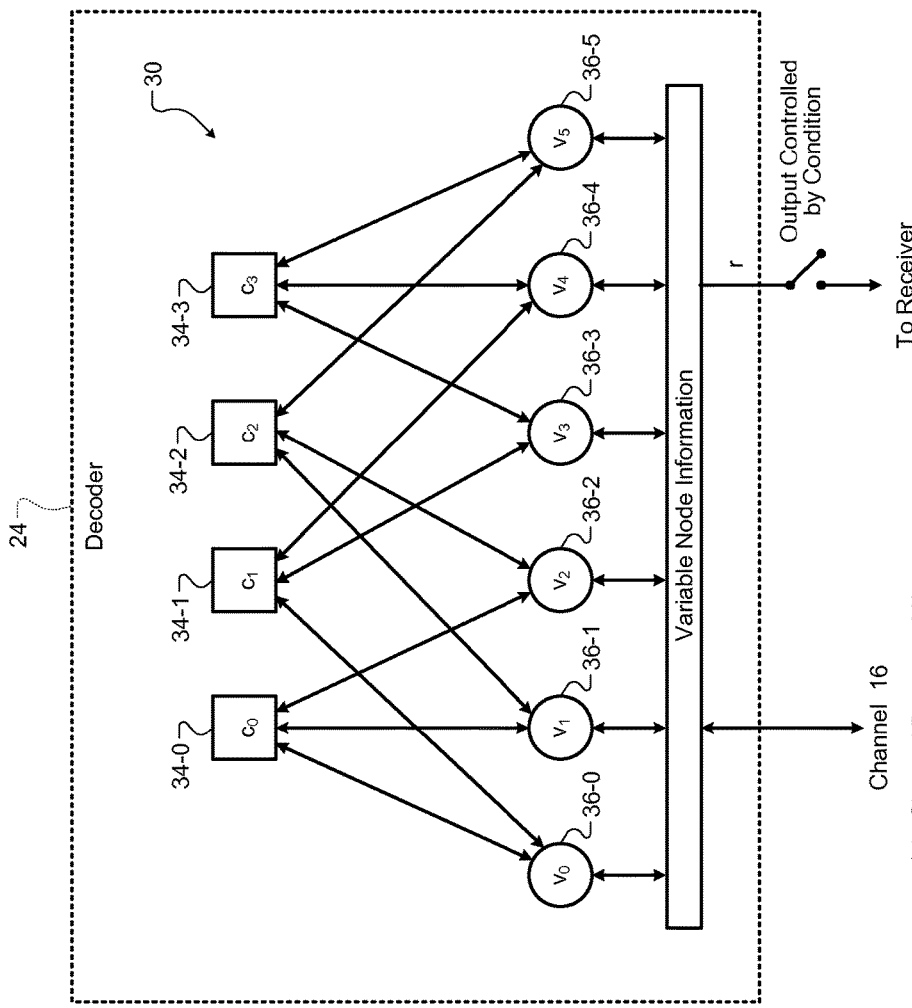
FIG. 2A depicts a plurality of nodes of a decoder.
FIG. 2B illustrates a relationship between the plurality of nodes and a parity-check matrix.
Figure 3B:
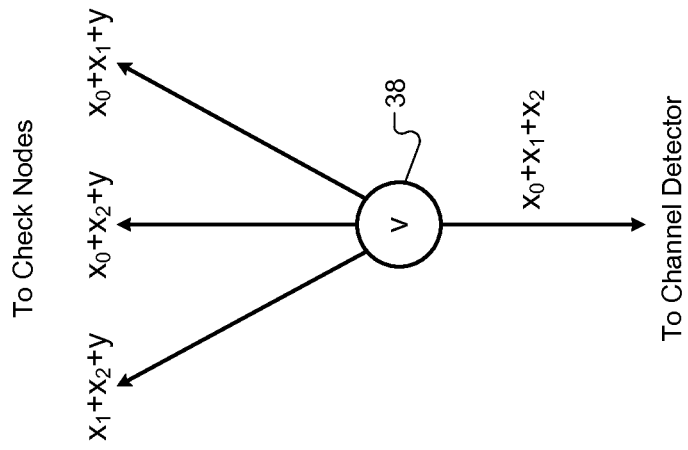
FIG. 3B shows messages between a variable node and check nodes.
Figure 3A:
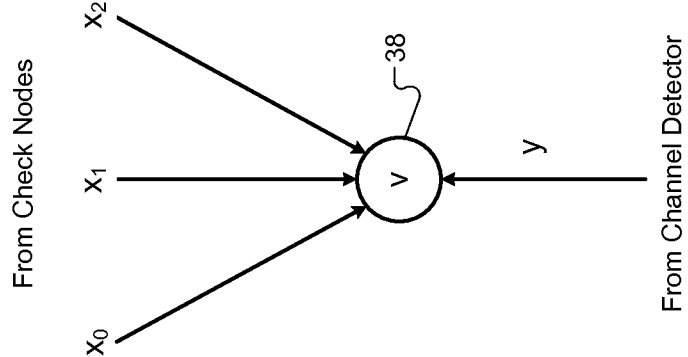
FIG. 3A shows an example of a variable node computation.

Bit flipping (BF) decoders are a class of low complexity iterative decoders used to decode low-density parity-check (LDPC) codes. There are a number of variants of BF decoders. For example, BF decoders can process hard input (hard decisions) as well as soft input (reliability information for the hard decisions).

In the most general architecture of a BF decoder, a variable node state of a bit is represented by V bits, and a check node state of the bit is represented by C bits, where V and C are integers greater than or equal to one. In each iteration, a variable node looks at its current state and the states of all neighboring check nodes. Based on these two pieces of information, the variable node decides its new state. The check nodes are updated to reflect the new state of the variable node.

The complexity of a BF decoder, and therefore the die area occupied by the BF decoder, depends on the number of bits stored per variable node. The complexity also depends on the number of bits per check node. The number of check nodes, however, is usually less than the number of variable nodes. The performance of the BF decoder is therefore generally proportional to the number of bits per variable node.

The amount of memory used to store the variable node states depends on the number of bits per variable node. One way to reduce the amount of memory is to reduce the number of bits per variable node. Reducing the number of bits per variable node, however, can degrade the performance of the BF decoder.

For example, consider a 2V1C BF decoder with one bit input that uses two bits per variable node and one bit per check node (hence the name 2V1C BF decoder) and that receives one bit input (i.e., the input is a hard decision). In the 2V1C BF decoder with one bit input, every variable node has two bits of storage (i.e., four states), and every check node state is represented by one bit (i.e., two states).

Of the two bits of a variable node, one bit stores the current estimate of the variable node state, and one bit stores an indication indicating if the variable node has been flipped from its original value (i.e., toggled from a 1 to a 0 or from a 0 to a 1). In each iteration, the current estimate of the variable node can be flipped based on the number of unsatisfied check node neighbors (e.g., based on whether the number of unsatisfied check node neighbors is greater than or equal to a predetermined threshold), and whether the variable node was flipped from the original value.

In general, the number of errors correctable by the BF decoder is a small fraction of the length of the codeword being decoded. Consequently, the total number of bits flipped from their original value is very small. This implies that a vector that contains information as to whether a variable node is flipped from its original value, called a flip vector, is very sparse and hence compressible.

As another example, consider a 2V1C BF decoder with two bit input (i.e., one input is a hard decision and another input is a one bit soft decision (reliability bit) for the hard decision). In the 2V1C BF decoder with two bit input, every variable node has two bits of storage (i.e., four states), and every check node state is represented by one bit (i.e., two states) (and hence the name 2V1C BF decoder).

Of the two bits of a variable node, one bit stores the current estimate of the variable node (i.e., hard decision), and one bit stores the reliability of the variable node (i.e., reliability of the hard decision and therefore called a reliability bit). In each iteration, the current estimate of the variable node can be flipped based on the number of unsatisfied check node neighbors and the reliability of the variable node. The reliability of the variable node may also be updated. In general, a vector that contains the reliability information of variable nodes, called a reliability vector, is also sparse and hence compressible.

There are other variants of the BF decoder. For example, consider BF decoders with one bit input or two bit input that store three bits per variable node and whose check node state can be represented by one bit. Of the three bits of a variable node, a first bit stores a current estimate of a hard decision, a second bit stores the reliability of the hard decision (reliability vector), and a third bit stores an indication indicating whether the current estimate differs from the original hard decision (flip vector). In this case, the reliability vector and the flip vector are sparse and hence compressible.

Another variant of BF decoders is a class of decoders called hybrid message-passing BF decoders, where different check nodes connected to a variable node can see a different value of the variable node. Here, messages can be thought of as being stored on the edges connecting variable nodes to check nodes (i.e., messages can be stored in an edge message memory). For most of the variable nodes, however, the check nodes see the same value of the variable node. The edge message memory can therefore be compressed by storing the edge messages for only those variable nodes that have edge messages that are different from their current decision.

Figure 4:
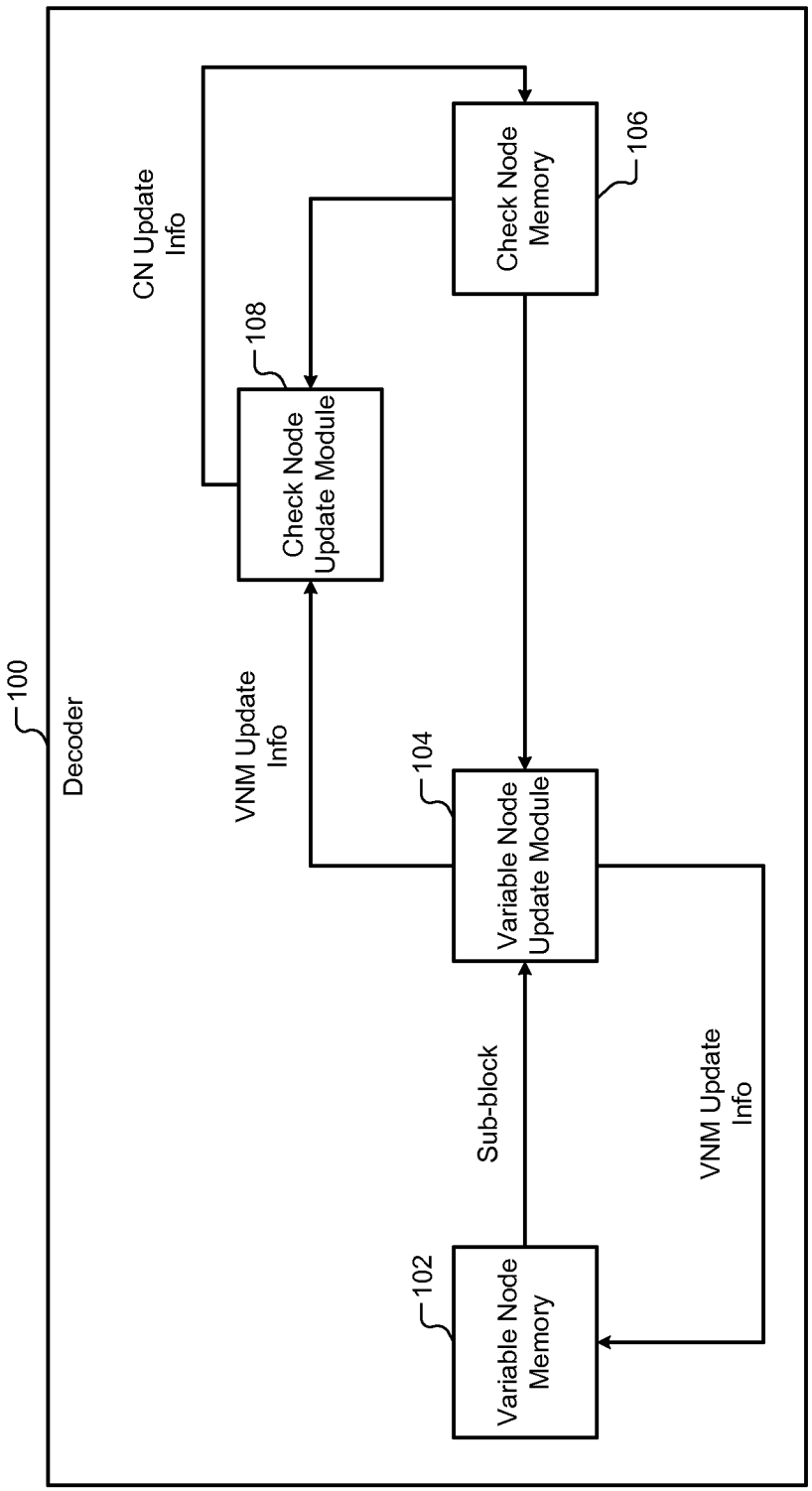
FIG. 4 shows a functional block diagram of a bit flipping (BF) decoder.

FIG. 4 shows an example of a BF decoder 100. The BF decoder 100 comprises a variable node (VN) memory 102, a VN update module 104, a check node (CN) memory 106, and a CN update module 108. The VN memory 102 stores the variable node states. The size of the VN memory 102 increases as the number of bits per variable node used to store the variable node states increases. The CN memory 106 stores the check node states.

The VN update module 104 receives a current variable node state from the VN memory 102 and corresponding check node state(s) from the CN memory 106. The VN update module 104 generates a VN memory (VNM) update information based on the current variable node state received from the VN memory 102 and the corresponding check node state(s) received from the CN memory 106. The VN update module 104 updates the variable node state in the VN memory 102 based on the VNM update information.

The CN update module 108 receives the VNM update information from the VN update module 104 and the check node state(s) from the CN memory 106. The CN update module 108 generates CN update information based on the VNM update information received from the VN update module 104 and the check node state(s) received from the CN memory 106. The CN update module 108 updates the corresponding check node state(s) in the CN memory 106 using the CN update information.

In practical BF decoders, the variable nodes can be processed in sub-blocks (e.g., based on portions of the VN memory 102) instead of processing the entire VN memory 102 in parallel in a given time period (e.g., in one or more clock cycles). In an iteration, all the variable nodes are processed. Instead of processing the entire VN memory 102 in a given time period (e.g., in one or more clock cycles), a subset of variable nodes (sub-blocks or portions of the VN memory 102) are processed at a time in a given time period (e.g., in one or more clock cycles). For example, in BF decoders using quasi-cyclic LDPC codes, a sub-block of variable nodes may include a circulant. In each cycle, a sub-block or a group of sub-blocks of variable nodes can be processed. Accordingly, memory compression schemes described below can also be applied to sub-blocks of the VN memory 102.

The complexity of a BF decoder depends primarily on the number of bits used to store the states of variable nodes. Accordingly, the amount of memory used to store the states of variable nodes can be reduced using memory compression schemes described below. Additionally, the amount of memory used to store the states of check nodes can also be reduced using the memory compression schemes described below.

The present disclosure proposes systems and methods in which the variable node states (and the check node states) of the bits are stored in a compressed format to reduce the storage requirements. The present disclosure uses BF decoders only as examples to illustrate the compression schemes disclosed herein. The compression schemes disclosed herein can be extended to any system that uses a decoder utilizing variable nodes and check nodes. Non-limiting examples of such decoders include message-passing decoders, hybrid message-passing decoders, and so on.

In general, the systems and methods proposed in the present disclosure can be utilized in any decoder architecture where messages are passed and stored. If the stored messages are compressible (e.g., if information in a small percentage of the messages or a portion of a message can be used in decoding), savings in memory used to store the messages can be achieved by compressing the messages as described below. Whether messages are compressible depends on their entropy (the average amount of information contained in 1 bit). For example, in a message-passing decoder, if many messages passed from variable nodes to check nodes are same or similar, then one or a few of the messages can be used in decoding and the rest of the messages can be disregarded. If most of the messages can be discarded and yet decoding can be reliably performed using one or a few of the messages, the messages are compressible. Similarly, if a large portion of a message can be discarded and yet decoding can be reliably performed using a small portion of the message, the message is compressible.

Figure 5:
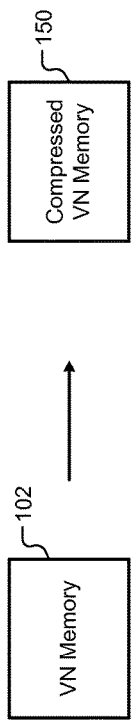
FIG. 5 shows a variable node memory of a decoder that is replaced by a compressed variable node memory.

FIG. 5 shows the VN memory 102 and a compressed VN memory 150. The compressed VN memory 150 stores the information (variable node states), which is typically stored in the VN memory 102, in a compressed form. The compressed VN memory 150 can be used to replace the VN memory 102. The type of compression used to compress the information (variable node states) can be lossy (involves a possibility of data loss after repeated compression) or lossless (data is not lost after repeated compression).

Figure 6:
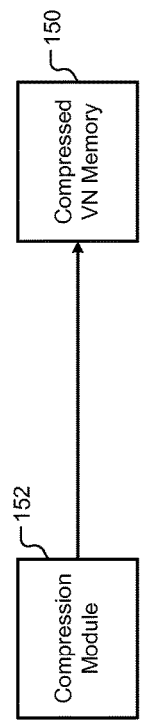
FIG. 6 shows a compression system comprising a compression module and a compressed variable node memory.

FIG. 6 shows a compression module 152 that compresses the information (variable node states) and stores the compressed the information (i.e., compressed variable node states) in the compressed VN memory 150. For example, the compression module 152 may compress the flip vectors and/or the reliability vectors. While hard decisions are not compressible, correlation between hard decisions and flip vectors or correlation between hard decisions and reliability vectors can provide an efficient way of compressing all the bits including the hard decisions.

Figure 7:
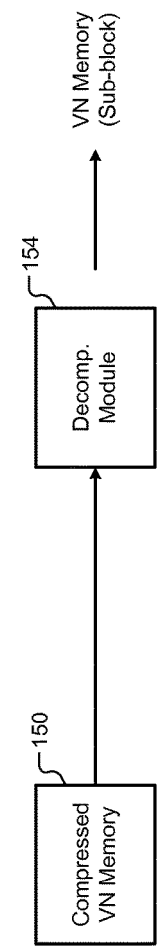
FIG. 7 shows a reading system comprising the compressed variable node memory and a decompression module.

FIG. 7 shows a decompression module 154 that reads the compressed information (i.e., compressed variable node states) stored in compressed format in the compressed VN memory 150 and that generates uncompressed information. The decompression module 154 can decompress the compressed information in units of sub-blocks and can generate the uncompressed information in units of sub-blocks. Again, the type of decompression used to decompress the compressed information (i.e., compressed variable node states) can be lossy (involves a possibility of data loss after repeated decompression) or lossless (data is not lost after repeated decompression).

Figure 8:
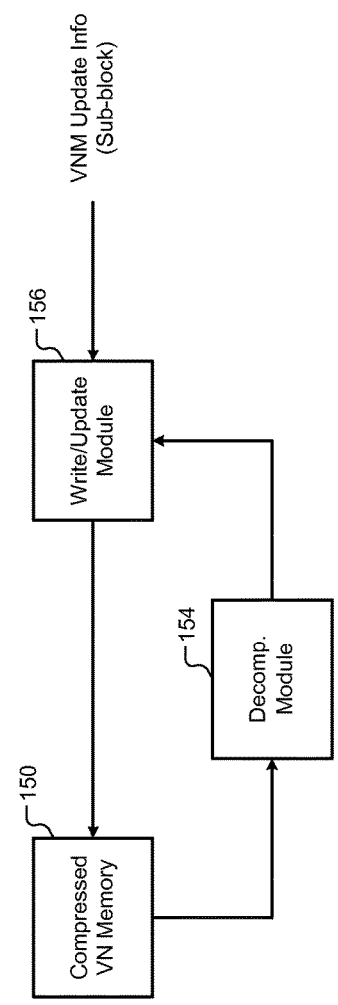
FIG. 8 shows a read/write/update system comprising the compressed variable node memory, the decompression module, and an update module.

FIG. 8 shows a write/update module 156 that receives the current information (e.g., current variable node state) in uncompressed format from the decompression module 154 and new information in uncompressed format. The new information is used to update the current information. The write/update module 156 generates an update information based on the current information and the new information. The write/update module 156 compresses the update information and writes the compressed update information into the compressed VN memory 150 to update the current information.

The write/update module 156 can perform the update operation on a sub-block of the compressed VN memory 150. Again, the type of compression used to compress the information (variable node states) can be lossy (involves a possibility of data loss after repeated compression) or lossless (data is not lost after repeated compression).

Figure 9:
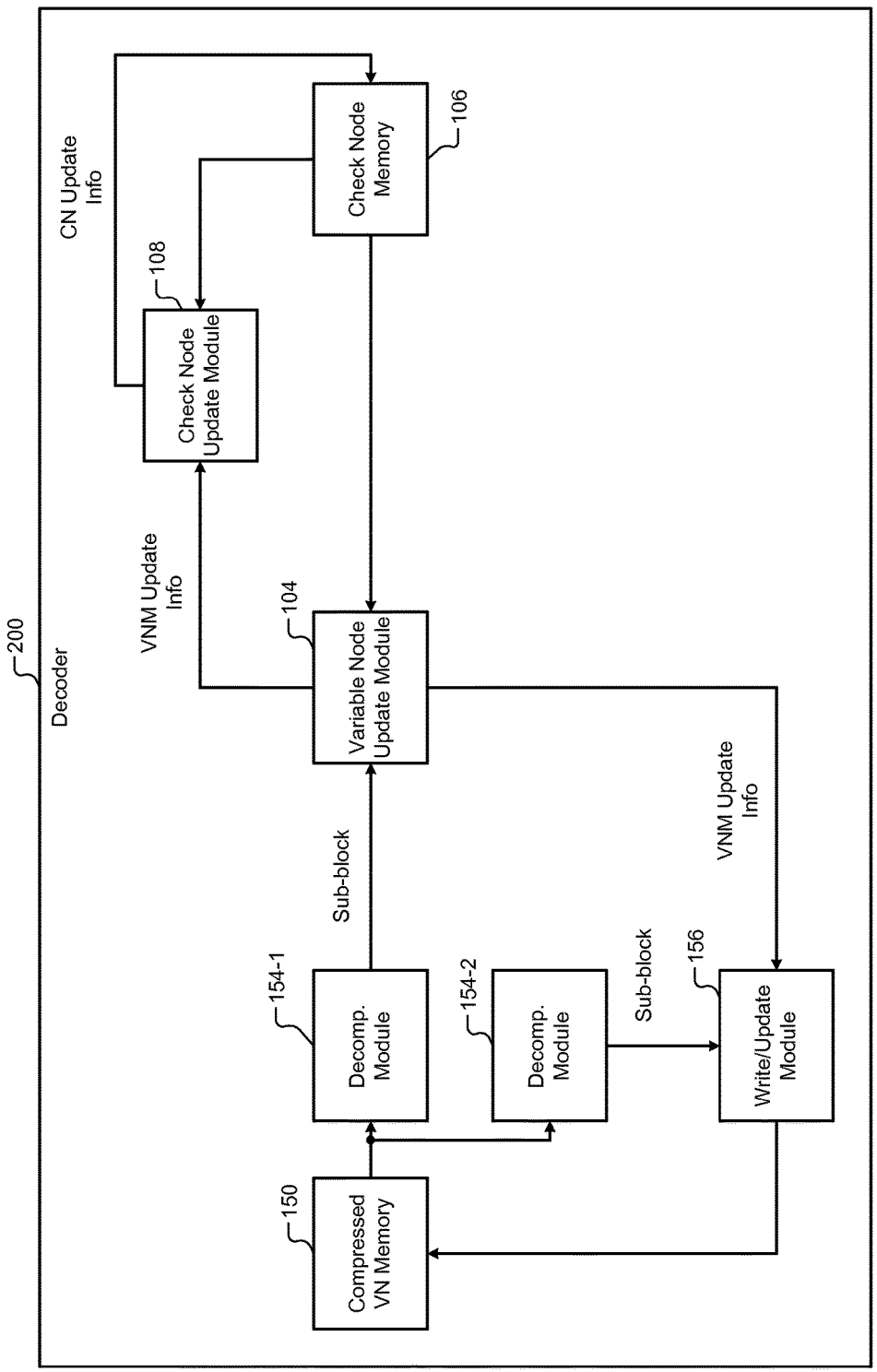
FIG. 9 shows a functional block diagram of a bit flipping (BF) decoder comprising the read/write/update system of FIG. 8.

FIG. 9 shows a decoder 200 comprising all of the modules of the decoder 100 shown in FIG. 4 except that the VN memory 102 is replaced by the compressed VN memory 150, one or two decompression modules 154-1 and 154-2, and the write/update module 156. The operation of each of the decompression modules 154-1 and 154-2 is similar to the operation of the decompression module 154 described with reference to FIG. 8. Also, while not shown, the compression module 152 is included in the decoder 200. For example, an input of the compression module 152 receives incoming data into the decoder 200 and an output of the compression module 152 is connected to the input of the compressed VN memory 150. In some implementations, the compression module 152 can be included in the compressed VN memory 150.

Figure 10:
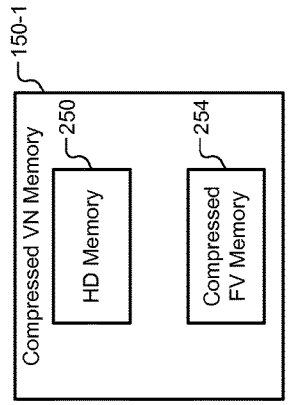

FIGS. 10-14 show examples of different embodiments. FIG. 10 shows an example of the VN memory 102 and the compressed VN memory 150 for a 2V1C BF decoder with one bit input. For example, a VN memory 102-1 for the 2V1C BF decoder with one bit input includes a HD memory 250 to store hard decisions and a flip vector (FV) memory 252 to store flip vectors. The VN memory 102-1 can be replaced by a compressed VN memory 150-1, which comprises the HD memory 250 and a compressed FV memory 254. The compression module 152 (shown in FIG. 6) compresses the flip vectors and stores the compressed flip vectors in the compressed FV memory 254.

Figure 11:
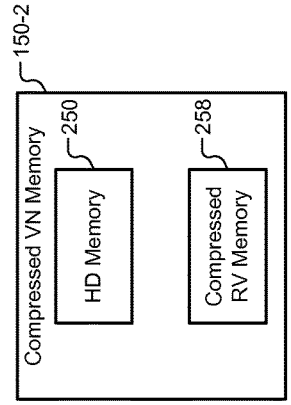

FIG. 11 shows an example of the VN memory 102 and the compressed VN memory 150 for a 2V1C BF decoder with two bit input. For example, a VN memory 102-2 for the 2V1C BF decoder with two bit input includes the HD memory 250 to store hard decisions and a reliability vector (RV) memory 256 to store reliability vectors. The VN memory 102-2 can be replaced by a compressed VN memory 150-2, which comprises the HD memory 250 and a compressed RV memory 258. The compression module 152 (shown in FIG. 6) compresses the reliability vectors and stores the compressed reliability vectors in the compressed RV memory 258. The compression is independent of the number of inputs to the decoder. Instead, the compression depends on the number of variable node states.

Figure 12:
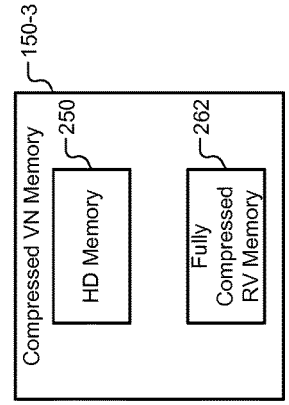

FIG. 12 shows an example of the VN memory 102 and the compressed VN memory 150 for a 2V1C BF decoder with two bit input, where the BF decoder receives partially compressed reliability vectors. For example, a VN memory 102-3 for the 2V1C BF decoder with two bit input that receives partially compressed reliability vectors includes the HD memory 250 to store hard decisions and a reliability vector (RV) memory 260 to store the partially compressed reliability vectors. The VN memory 102-3 can be replaced by a compressed VN memory 150-3, which comprises the HD memory 250 and a compressed RV memory 262. The compression module 152 (shown in FIG. 6) compresses the partially compressed reliability vectors and stores the fully compressed reliability vectors in the compressed RV memory 262. The compression is independent of the number of inputs to the decoder. Instead, the compression depends on the number of variable node states.

FIG. 13 shows an example of the VN memory 102 and the compressed VN memory 150 for a 3V1C BF decoder with one bit and two bit inputs. For example, a VN memory 102-4 for the 3V1C BF decoder includes the HD memory 250 to store hard decisions, a flip vector (FV) memory 264 to store flip vectors, and a reliability vector (RV) memory 266 to store reliability vectors. The VN memory 102-4 can be replaced by a compressed VN memory 150-4, which comprises the HD memory 250, a compressed FV memory 268, and a compressed RV memory 270. The compression module 152 (shown in FIG. 6) compresses the flip vectors and the reliability vectors and stores the compressed flip vectors and the compressed reliability vectors respectively in the compressed FV memory 268 and the compressed RV memory 270. The compression is independent of the number of inputs to the decoder. Instead, the compression depends on the number of variable node states.

FIG. 14 shows an example of the VN memory 102 and the compressed VN memory 150 for a hybrid message-passing BF decoder with one bit and two bit inputs. For example, a VN memory 102-5 for the hybrid message-passing BF decoder includes the HD memory 250 to store hard decisions and an edge message (EM) memory 272 to store messages. The VN memory 102-5 can be replaced by a compressed VN memory 150-5, which comprises the HD memory 250 and a compressed EM memory 274. The compression module 152 (shown in FIG. 6) compresses the messages and stores the compressed messages in the compressed EM memory 274. The compression is independent of the number of inputs to the decoder. Instead, the compression depends on the number of variable node states.

In general, a hybrid message-passing BF decoder also includes a flip-vector (FV) memory, which is compressible and should be compressed similar to the BF decoder. Accordingly, the VN memory 102-5 may also include an FV memory 273, and the compressed VN memory 150-5 may also include a compressed FV memory 275. The compression module 152 (shown in FIG. 6) compresses the contents of the FV memory 273 and stores the compressed contents of FV memory 273 in the compressed FV memory 275.

Following are examples of various compression schemes. In a first example, consider a compression scheme in which the flip vectors are compressed as follows. In every two bytes of data (i.e., every 16 bits of flip vector memory, where each bit indicates whether a corresponding variable node is flipped), positions of only the first two 1's are stored. The remaining data is not stored and is discarded. Since four bits are required to store one of the 16 possible positions of the 16 bits, only eight bits are required to store two positions of the first two 1's (i.e., positions of first two flipped variable nodes of the 16 variable nodes in the two bytes (e.g., VN2 and VN5)). Since only eight bits are required to store the positions of the first two 1's instead of 16 bits, a compression factor of two is achieved.

In a second example, consider another compression scheme in which the flip vectors are compressed as follows. In every two bytes of data (i.e., every 16 bits of flip vector memory, where each bit indicates whether a corresponding variable node is flipped), a position of only a first 1 is stored. The remaining data is not stored and is discarded. Since four bits are required to store one of the 16 possible positions of the 16 bits, only four bits are required to store a position of a first 1 (i.e., a position of a first flipped variable node of the 16 variable nodes in the two bytes (e.g., VN7 or VN10)). Since only four bits are required to store the position of the first 1 instead of 16 bits, a compression factor of four is achieved.

For a 2 KB code, if no compression is used, the amount of memory required is 2 KB to store the hard decisions plus 2 KB to store the flip vectors, which is a total of 4 KB. If a compression factor of 2 is used, the amount of memory is reduced to 3 KB: 2 KB for the hard decisions and 1 KB for the flip vectors. Thus, a compression factor of 2 results in 25% savings in die area.

In a third example, consider a hybrid message-passing BF decoder for a column-weight 6 code. In a column-weight 6 code, every variable node stores a total of eight bits: one bit for a current hard decision, 6 bits for messages sent from the variable node to 6 check nodes in previous iteration (and hence the name column-weight 6 code), and possibly 1 bit to indicate if current hard decision differs from original hard decision.

One possible way to compress the messages in the column-weight 6 code is as follows. Consider a group of 48 variable nodes. One can store the indices (positions) and edge messages of only the first four variable nodes that have at least one edge message differing from current hard decision. Specifically, for most variable nodes, the one hard decision bit and the corresponding 6 check node bits will be in agreement. For the variable nodes for which the one hard decision bit and the corresponding 6 check node bits are in agreement, the 6 check node bits are not stored and are discarded. Out of those variable nodes for which the one hard decision bit and the corresponding 6 bits are not in agreement, only the first four variable nodes are selected. The locations of the selected first four variable nodes and corresponding 6 bits are stored. The remaining data is not stored and is discarded.

Six bits are necessary to store a location of one of the 48 variable nodes since $32<48<64$, $2^5=32$, and $2^6=64$. Thus, (four variable nodes times 6 bits to store location of each variable node=24 bits)+(6 check node bits corresponding to each of the four variable node (i.e., 4×6=24 bits))=a total of 48 bits are required to store the information of the 48 variable nodes. Storing 48 bits instead of 6*48 bits (6 bits per variable node times 48 variable nodes) provides a compression factor of 6 (from 48*6 bits to 48 bits).

For a 2 KB code, if no compression is used, the amount of memory required for a Hybrid message-passing BF decoder to store 1 bit for HD, 1 bit to indicate flip, and 6 bits for edge messages (i.e., a total of 8 bits) is 8 times 2 KB=16 KB. By compressing edge messages and the flip vector, the required memory is 5Kbytes, which provides an area savings of 68.75%. (1 bit for hard decision; 1 bit flip vector compressed, for example, by a factor of 2 to 0.5; and 6 bits compressed by a factor of 6 to 1; which yields a total of 1+0.5+1=2.5 bits times 2 KB=5 KB.) By compressing only the edge messages and not compressing the flip vector, the required memory is 6 KB, which provides an area savings of 62.5%. (1 bit for hard decision, 1 bit flip vector, and 6 bits compressed by a factor of 6 to 1, which yields a total of 1+1+1=3 bits times 2 KB=6 KB.)

The compression schemes disclosed herein for variable nodes are equally applicable to check nodes. Throughout the present disclosure, BF decoders are used only as examples to illustrate the compression schemes. The compression schemes can be extended to any system that uses a decoder utilizing variable nodes and check nodes (e.g., message-passing decoders, hybrid message-passing decoders, and so on). In general, the compression schemes proposed in the present disclosure can be utilized in any decoder architecture where messages are passed and stored if the stored messages are compressible (e.g., if information in a small percentage of the messages can be used in decoding).

Figure 15:
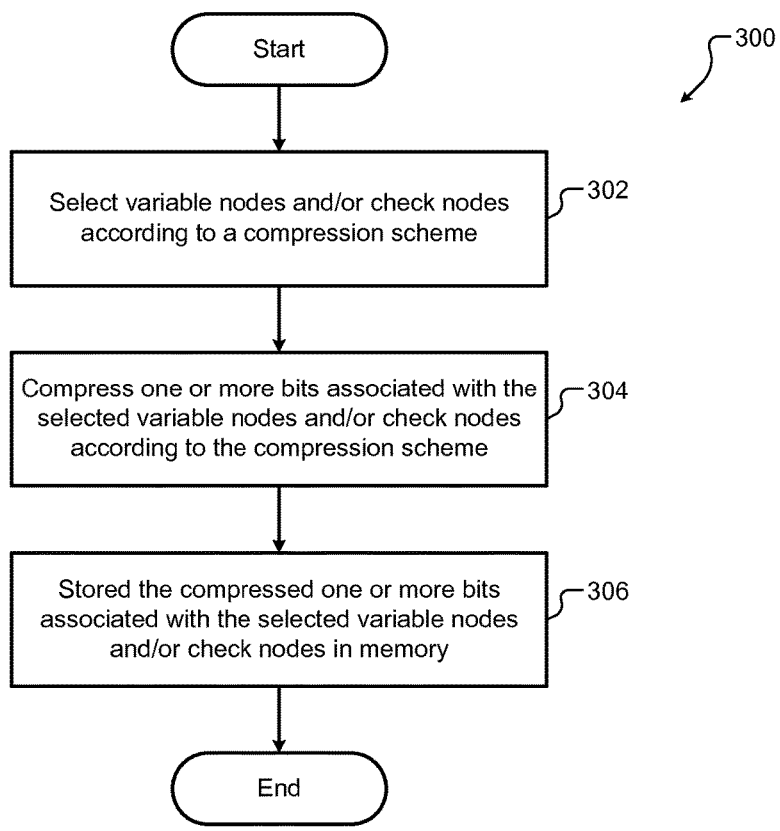
FIG. 15 is a flowchart of a method for compressing variable node (VN) and/or check node (CN) information.

FIG. 15 shows a method 300 for compressing variable node (VN) and/or check node (CN) information. At 302, control selects variable nodes and/or check nodes according to a compression scheme. See description related to FIGS. 17 and 18 for examples of compression schemes. At 304, control compresses one or more bits associated with the selected variable nodes and/or check nodes according to the compression scheme. For example, the one or more bits may include bits from the flip vector and/or the reliability vector. Additionally or alternatively, the one or more bits may include edge messages. At 306, control stores the compressed one or more bits associated with the selected variable nodes and/or check nodes in memory.

Figures 16, 18:
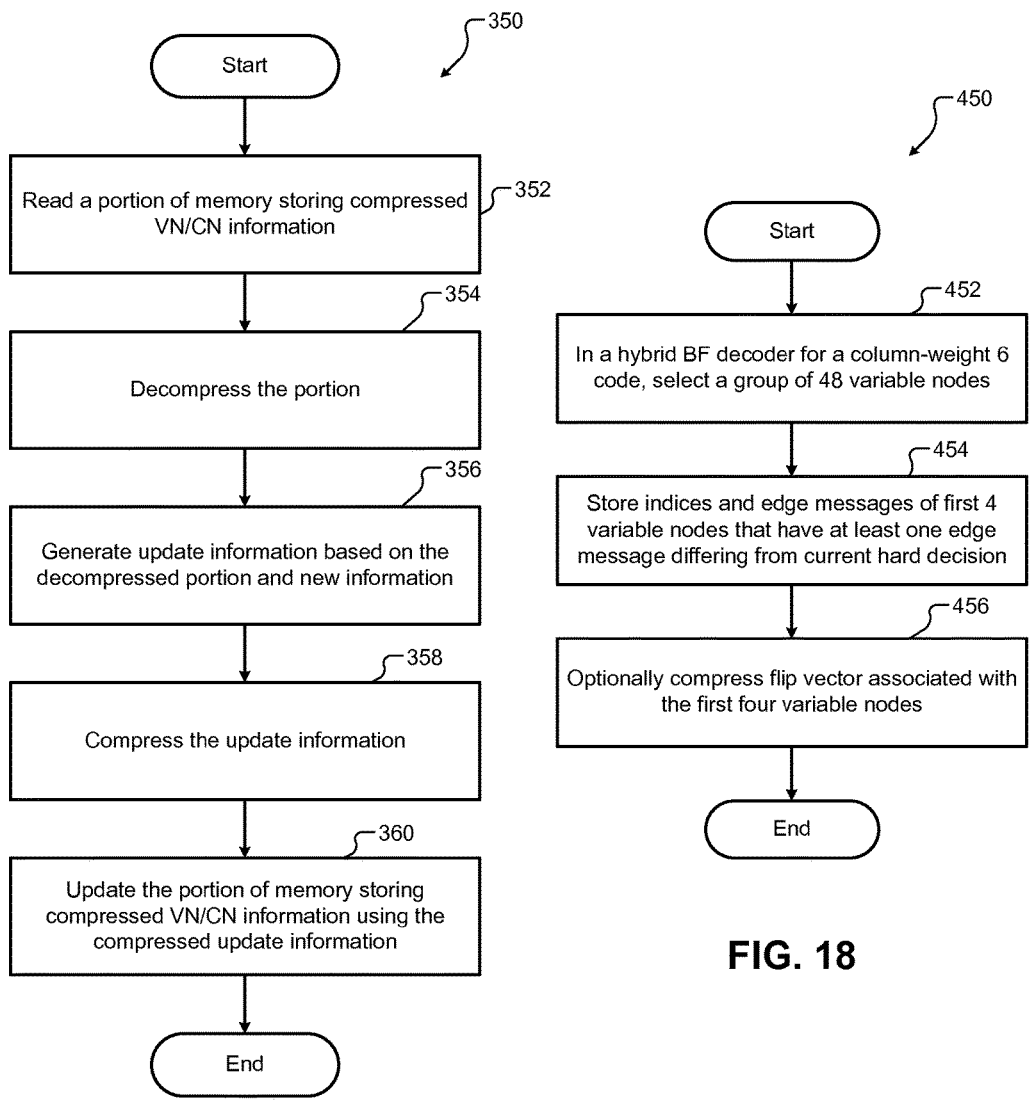
FIG. 16 is a flowchart of a method for updating stored compressed VN/CN information.
FIG. 18 is a flowchart of a method for compressing VN/CN information using a compression scheme.

FIG. 16 shows a method 350 for updating stored compressed VN/CN information. At 352, control reads a portion of memory that stores compressed VN/CN information. At 354, control decompresses the portion. At 356, control generates update information based on the decompressed portion and new information. For example, the new information for updating stored compressed VN information may be based on the decompressed portion and check node information. At 358, control compresses the update information. At 360, control updates the portion of memory that stores the compressed VN/CN information using the compressed update information.

Figure 17:
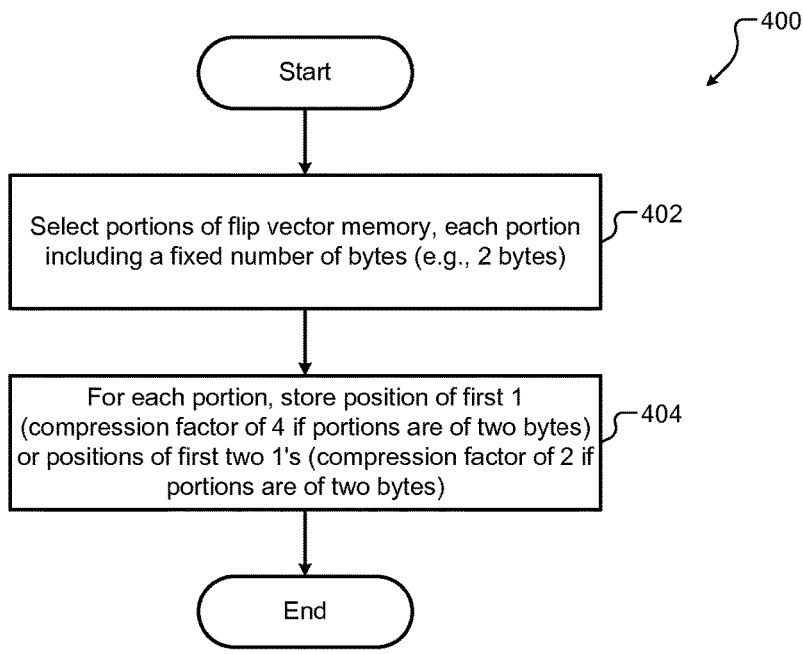
FIG. 17 is a flowchart of a method for compressing VN/CN information using a compression scheme.

FIG. 17 shows a method 400 for compressing VN/CN information including an example of a compression scheme. At 402, control selects portions of memory that stores flip factors. For example, each portion may include a fixed number of bytes (e.g., two bytes). At 404, for each portion, control stores the position of a first 1 in memory (providing a compression factor of four), or control stores the positions of first two 1's in memory (providing a compression factor of two).

FIG. 18 shows a method 450 for compressing VN/CN information including an example of a compression scheme. At 452, in a hybrid BF decoder for column-weight 6 code, for example, control selects a group of 48 variable nodes. At 454, control stores the indices (i.e., positions or locations) and edge messages of first four variable nodes that have at least one edge message differing from current hard decision. Control does not compress flip vectors associated with the first four variable nodes (providing area saving of 62.5%). At 456, control optionally compresses flip vectors associated with the first four variable nodes (providing area saving of 68.75%).

The systems and methods of the present disclosure can be used to decode data in communication devices including wireless communication devices. The systems and methods of the present disclosure can also be used to decode data in storage devices including magnetic and optical storage devices (e.g., hard disk drives, compact disc (CD) drives, and digital versatile disc (DVD) drives), and memory devices (e.g., solid-state disks).

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In this application, including the definitions below, the term 'module' or the term 'controller' may be replaced with the term 'circuit.' The term 'module' may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium include nonvolatile memory circuits (such as a flash memory circuit or a mask read-only memory circuit), volatile memory circuits (such as a static random access memory circuit and a dynamic random access memory circuit), and secondary storage, such as magnetic storage (such as magnetic tape or hard disk drive) and optical storage.

The apparatuses and methods described in this application may be partially or fully implemented by a special purpose computer created by configuring a general purpose computer to execute one or more particular functions embodied in computer programs. The computer programs include processor-executable instructions that are stored on at least one non-transitory, tangible computer-readable medium. The computer programs may also include or rely on stored data. The computer programs may include a basic input/output system (BIOS) that interacts with hardware of the special purpose computer, device drivers that interact with particular devices of the special purpose computer, one or more operating systems, user applications, background services and applications, etc.

The computer programs may include: (i) assembly code; (ii) object code generated from source code by a compiler; (iii) source code for execution by an interpreter; (iv) source code for compilation and execution by a just-in-time compiler, (v) descriptive text for parsing, such as HTML (hypertext markup language) or XML (extensible markup language), etc. As examples only, source code may be written in C, C++, C#, Objective-C, Haskell, Go, SQL, Lisp, Java®, ASP, Perl, Javascript®, HTML5, Ada, ASP (active server pages), Perl, Scala, Erlang, Ruby, Flash®, Visual Basic®, Lua, or Python®.

None of the elements recited in the claims is intended to be a means-plus-function element within the meaning of 35 U.S.C. §112(f) unless an element is expressly recited using the phrase "means for", or in the case of a method claim using the phrases "operation for" or "step for".

What is claimed is:

1. A decoder comprising:
a compression module configured to
select one or more nodes from a plurality of nodes associated with data being decoded by the decoder, wherein each of the plurality of nodes includes a plurality of bits, and wherein the plurality of bits associated with one of the plurality of nodes includes (i) a first bit indicating whether a current estimate associated with the one of the plurality of nodes is flipped relative to a prior value of the current estimate and (ii) a second bit indicating reliability of the current estimate; and
compress the plurality of bits associated with the selected one or more nodes to generate compressed information; and
a memory configured to store the compressed information associated with the selected one or more nodes.

2. The decoder of claim 1, wherein each of the plurality of nodes includes a variable node or a check node.

3. The decoder of claim 1, wherein the plurality of bits associated with the one of the plurality of nodes includes one or more messages associated with one or more edges between one of the selected one or more nodes and one or more corresponding check nodes.

4. The decoder of claim 1, wherein the plurality of bits is received by the decoder in a compressed form.

5. The decoder of claim 1, further comprising:
a decompression module configured to decompress a portion of the compressed information stored in the memory and to generate decompressed information; and
an update module configured to
receive new information to update the portion of the compressed information,
generate an update information based on the new information and the decompressed information,
compress the update information, and
update the portion of the compressed information stored in the memory using the compressed update information.

6. The decoder of claim 5, further comprising a variable node update module configured to:
receive the decompressed information and check node information corresponding to the plurality of bits stored in a check node memory, and
generate the new information to update the portion of the compressed information based on the decompressed information and the check node information.

7. The decoder of claim 6, further comprising a check node update module configured to:
receive the new information and the check node information,
generate a check node update information to update the check node information stored in the check node memory, and
update the check node information stored in the check node memory using the check node update information.

8. The decoder of claim 1, wherein in response to the plurality of nodes including a plurality of variable nodes:
the compression module is configured to
select one or more check nodes from a plurality of check nodes associated with the plurality of variable nodes, wherein each check node includes check node information, and
compress the check node information associated with the selected check nodes; and
the memory is configured to store the compressed check node information associated with the selected check nodes.

9. The decoder of claim 8, wherein the plurality of variable nodes and the plurality of check nodes form elements of a parity-check matrix associated with a code used by the decoder to decode the data.

10. The decoder of claim 9, wherein the code includes a low-density parity-check code or a quasi-cyclic low-density parity-check code.

11. The decoder of claim 1, wherein the decoder includes:
a bit flipping decoder;
a message-passing bit flipping decoder; or
a hybrid message-passing bit flipping decoder.

12. A method comprising:
selecting one or more nodes from a plurality of nodes associated with data being decoded by a decoder, wherein each of the plurality of nodes includes a plurality of bits, and wherein the plurality of bits associated with one of the plurality of nodes includes (i) a first bit indicating whether a current estimate associated with the one of the plurality of nodes is flipped relative to a prior value of the current estimate and (ii) a second bit indicating reliability of the current estimate;
compressing the plurality of bits associated with the selected one or more nodes to generate compressed information; and
storing in memory the compressed information associated with the selected one or more nodes.

13. The method of claim 12, wherein each of the plurality of nodes includes a variable node or a check node.

14. The method of claim 12, wherein the plurality of bits associated with the one of the plurality of nodes includes one or more messages associated with one or more edges between one of the selected one or more nodes and one or more corresponding check nodes.

15. The method of claim 12, wherein the plurality of bits is received by the decoder in a compressed form.

16. The method of claim 12, further comprising:
decompressing a portion of the compressed information stored in the memory and to generate decompressed information;
receiving new information to update the portion of the compressed information;

generating an update information based on the new information and the decompressed information;
compressing the update information; and
updating the portion of the compressed information stored in the memory using the compressed update information.

17. The method of claim 16, further comprising:
receiving the decompressed information and check node information corresponding to the plurality of bits stored in a check node memory; and
generating the new information to update the portion of the compressed information based on the decompressed information and the check node information.

18. The method of claim 17, further comprising:
receiving the new information and the check node information;
generating a check node update information to update the check node information stored in the check node memory; and
updating the check node information stored in the check node memory using the check node update information.

19. The method of claim 12, wherein in response to the plurality of nodes including a plurality of variable nodes, the method further comprising:
selecting one or more check nodes from a plurality of check nodes associated with the plurality of variable nodes, wherein each check node includes check node information;
compressing the check node information associated with the selected check nodes; and
storing the compressed check node information associated with the selected check nodes.

20. The method of claim 19, wherein the plurality of variable nodes and the plurality of check nodes form elements of a parity-check matrix associated with a code used by the decoder to decode the data.

21. The method of claim 20, wherein the code includes a low-density parity-check code or a quasi-cyclic low-density parity-check code.

22. The method of claim 12, wherein the decoder includes:
a bit flipping decoder;
a message-passing bit flipping decoder; or
a hybrid message-passing bit flipping decoder.

* * * * *